United States Patent [19]

Schermer et al.

[11] 4,215,359

[45] Jul. 29, 1980

[54] SEMICONDUCTOR DEVICE

[75] Inventors: Gijsbertus J. H. Schermer; Paul Breuning, both of Eindhoven, Netherlands

[73] Assignee: U.S. Philips Corporation, New York, N.Y.

[21] Appl. No.: 958,769

[22] Filed: Nov. 8, 1978

[30] Foreign Application Priority Data

Dec. 13, 1977 [NL] Netherlands .......................... 7713758

[51] Int. Cl.² ............................................ H01L 23/48
[52] U.S. Cl. ........................................ 357/70; 357/72; 357/79
[58] Field of Search .............................. 357/70, 72, 79

[56] References Cited

U.S. PATENT DOCUMENTS 3,743,893   7/1973   Yamomoto ............................ 357/79

*Primary Examiner*—Edward J. Wojciechowicz
*Attorney, Agent, or Firm*—Thomas A. Briody; Jack Oisher; Steven R. Biren

[57] ABSTRACT

A semiconductor device which comprises an insulating flexible substrate having conductors extending on one side of the foil from the edge to near the center. A semiconductor element is connected with its contacts connected to the ends of the conductors at the center of the foil. On the side of the foil remote from the conductors a reinforcement member is provided which is present at least near the edges of the foil, the reinforcement member being connected in an adhering manner to the foil and having a pre-shaped contour so as to bend the foil in such manner that the surface of the semiconductor element remote from the foil and the ends of the conductors situated near the edges of the foil are situated substantially in the same plane.

7 Claims, 5 Drawing Figures

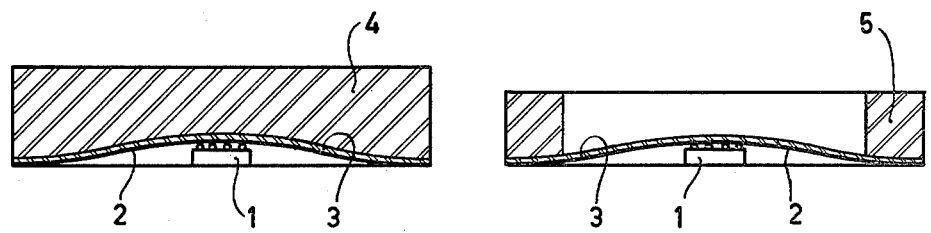
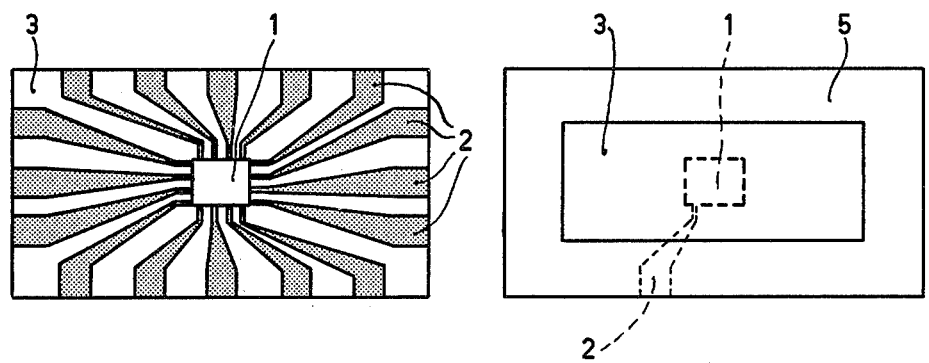
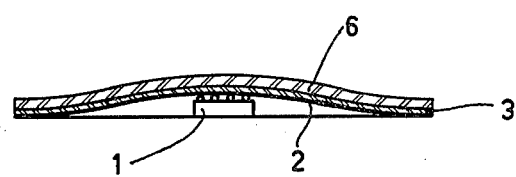

SEMICONDUCTOR DEVICE

The invention relates to a semiconductor device comprising an insulating flexible foil having conductors on one side of the foil extending from the edge towards the center and a semiconductor element comprising contacts which are connected to the ends of the conductors directed towards the center of the foil.

Semiconductor devices of the said type are preferably used in a construction which is as simple as possible, that is, without providing an expensive envelope. The assembly of such semiconductor devices, for example on an insulating substrate, however, may present problems. During the assembly the back side of the semiconductor element will preferably be situated against the substrate surface so as to obtain a good heat dissipation. In that case the foil edges will have to be pressed towards the substrate surface, and during the connection pressure will have to be exerted both on the semiconductor element and on the foil edges. Therefore, a special assembly apparatus will have to be used.

It is the object of the invention to provide a semiconductor device of the kind mentioned above which is simple of construction and which is suitable for mounting on a substrate without specific assembly apparatus. In order to achieve the end in view, according to the invention the foil comprises on its side remote from the conductors a reinforcement member which is present at least near the edges of the foil, the said reinforcement member being connected to the foil in an adhering manner and exerting a bend on the foil in such manner that the surface of the semiconductor element remote from the foil and the ends of the conductors situated near the edges of the foil are situated substantially in the same flat plane.

By simply ensuring that during the manufacture of the semiconductor device the rear side of the semiconductor element and the edges of the foil comprising the conductors are situated permanently in the same flat plane, the assembly of the semiconductor device is considerably simplified.

In a preferred embodiment the reinforcement member consists of a synthetic resin which is provided on the foil and is cured in a contour in which the surface of the semiconductor element remote from the foil and the ends of the conductors situated near the edges of the foil are situated substantially in the same plane.

The reinforcement member may alternatively consist of a profiled stiff strip which is connected in an adhering manner to the foil, the profile corresponding to the desired configuration of the foil.

In a further embodiment the reinforcement member consists of an annular element which is secured to the foil near the edge of the foil in a position of the foil in which the rear side of the semiconductor element and the ends of the conductors situated near the edges of the foil are situated substantially in one flat plane.

This and further embodiments will be described in greater detail with reference to the drawing.

In the drawing:

FIG. 1 is a cross-sectional view of a semiconductor device having a reinforcement member made of a synthetic resin.

FIG. 2 is a plan view of the semiconductor device shown in FIG. 1, as seen from below.

FIG. 3 shows an embodiment of a semiconductor device having a reinforcement member consisting of an annular element.

FIG. 4 is a plan view of the semiconductor device shown in FIG. 3, and

FIG. 5 shows an embodiment of a semiconductor device having a reinforcement member consisting of a profiled stiff strip.

The semiconductor device shown in the figures is of the type in which a semiconductor element 1, for example an integrated circuit, is secured to conductors 2 of a flexible insulating foil 3. The foil is, for example, a polyimide having a thickness of 25 microns. The conductors provided on the foil extend from the center towards the edges. The semiconductor element may be provided with soldering balls by means of which the semiconductor element is secured to the conductors 2 extending towards the center of the foil. FIG. 2 shows an embodiment of the pattern of conductors 2 in which said conductors extend towards the four edges of the foil. It will be obvious that other conductor patterns may alternatively be used, for example, a pattern in which the conductors extend to two oppositely located edges of the foil. Between the active side of the semiconductor element 1 and the foil a lacquer may be present which protects the semiconductor element sufficiently against ambient influences; in that case a further envelope is not necessary, and the resulting structure is more economical to manufacture.

The connection on a substrate of a foil 3 with the semiconductor element 1 provided thereon requires special apparatus. The surface of the semiconductor element remote from the active side is preferably connected to the substrate so as to obtain good heat dissipation, for example, by means of a solder or a conductive glue. The edges of the foil must be bent towards the substrate and be pressed-on so as to connect the conductor ends to conductors on the substrate. The connection apparatus will have to comprise means to hold the semiconductor device, to position it with respect to the substrate, to press the semiconductor element against the substrate and to press the edges of the foil towards the substrate.

The invention provides a semiconductor device which is simple in construction and which can also be assembled simply and without complicated apparatus. For that purpose a reinforcement member is provided which is contoured to ensure that the surface of the semiconductor element remote from the active side and the ends of the conductors near the edges of the foil are situated substantially in the same flat plane. The semiconductor device is now easy to handle and when connecting the semiconductor device to a substrate the semiconductor element and the edges of the foil need not be separately pressed-on.

In the embodiment shown in FIGS. 1 and 2 the reinforcement member 4 is formed from a synthetic resin. The foil 3 with the semiconductor element 1 connected thereon may be provided in a mold in which the rear side of the semiconductor element and the edges of the foil are pressed against the bottom. The mold is then filled with synthetic resin. The synthetic resin may be a lacquer, for example acrylate, which is cured by means of ultraviolet light. The cured lacquer now constitutes the reinforcement member which ensures by its contour that the lower side of the semiconductor element and the conductor ends along the edges of the foil are situated permanently in one flat plane. The connection of the semiconductor element to a substrate comprising the conductors can now be carried out in a simple manner.

FIG. 2 is a bottom view of the device shown in FIG. 1. As will be obvious from these two figures, the reinforcement member extends up to the edges of the foil. However, this is not necessary and the foil edges may also project beyond the reinforcement member over a small distance. Furthermore, the reinforcement member need not have a block shape as shown in FIGS. 1 and 2.

Instead of the lacquer as a reinforcement member, another synthetic resin may alternatively be chosen. It has proved favorable to use a reinforcement member of a glass fiber-reinforced polyester resin which cures at 150° C. Both when using the lacquer and when using the resin, an adhesive, preferably a polyester adhesive, may be provided on the foil so as to obtain good adhesion.

FIGS. 3 and 4 show a further embodiment. In this case the reinforcement member consists of a ring 5 which is connected to the foil near the edges. By performing the connection, for example by means of an adhesive, in the pre-shaped contour of the foil as shown, said shape is maintained and the rear face of the semiconductor body and the conductor ends near the edges of the foil remain situated in one plane. In this case also, the reinforcement member in the form of the ring 5 may be a synthetic resin. Furthermore, for example, a metal ring may be used; in that case the foil edges should slightly project beyond the ring so as to prevent a short-circuit.

A further embodiment is shown in FIG. 5. A pre-shaped profiled member 6, for example of synthetic resin or metal, has such a shape that after the connection to the foil the rear side of the semiconductor and the ends of the conductors along the edges of the foil are situated in the same plane. The pre-shaped profiled member 6 may again be a synthetic resin or a metal and is preferably secured to the foil by means of a glue.

What is claimed is:

1. A semiconductor device comprising an insulating flexible foil having conductors on one side of the foil extending from the edge towards the center, and a semiconductor element having contacts which are connected to the ends of the conductors at the central portion of the foil, characterized in that a reinforcement member is provided on the side of the foil remote from the conductors which is present at least near the edges of the foil, said reinforcement member being connected to the foil in an adhering manner and having a pre-shaped contour so as to bend the foil in such manner that the surface of the semiconductor element remote from the foil and the ends of the conductors situated near the ends of the foil are situated substantially in the same plane.

2. A semiconductor device as claimed in claim 1, characterized in that the reinforcement member comprises a synthetic resin which is provided on the foil and is cured in a contour in which the surface of the semiconductor element remote from the foil and the ends of the conductors situated near the edges of the foil are situated substantially in the same plane.

3. A semiconductor device as claimed in claim 1, characterized in that the reinforcement member is a profiled stiff strip which is connected to the foil in an adhering manner, the profile corresponding to the desired bend of the foil.

4. A semiconductor device as claimed in claim 1, characterized in that the reinforcement member is an annular element which is secured to the foil near the edge in a position of the foil in which the rear side of the semiconductor element and the ends of the conductors situated near the edges of the foil are situated substantially in one flat plane.

5. A semiconductor device as claimed in claim 2, characterized in that the reinforcement member is a lacquer, which cures under the influence of ultraviolet light.

6. A semiconductor device as claimed in claim 2, characterized in that the reinforcement member is a glass fiber-reinforced polyester resin.

7. A semiconductor device as claimed in claim 4, characterized in that the space between the annular element and the foil surface is filled with a synthetic resin.

* * * * *